(12) United States Patent
Ebel et al.

(10) Patent No.: US 10,101,417 B2
(45) Date of Patent: Oct. 16, 2018

(54) METHODS AND DEVICES FOR RF COILS IN MRI SYSTEMS

(71) Applicant: General Electric Company, Schenectady, NY (US)

(72) Inventors: Andreas Ebel, Waukesha, WI (US); Melissa Jean Freeman, Oconomowoc, WI (US); Clyve Konrad Rosales Follante, Twinsburg, OH (US); Hyokwon Nam, Sussex, WI (US)

(73) Assignee: General Electric Company, Schenectady, NY (US)

( * ) Notice: Subject to any disclaimer, the term of this patent is extended or adjusted under 35 U.S.C. 154(b) by 524 days.

(21) Appl. No.: 14/817,138

(22) Filed: Aug. 3, 2015

(65) Prior Publication Data
US 2017/0038443 A1 Feb. 9, 2017

(51) Int. Cl.
*G01V 3/00* (2006.01)
*G01R 33/36* (2006.01)

(52) U.S. Cl.
CPC .......... *G01R 33/36* (2013.01); *G01R 33/3664* (2013.01)

(58) Field of Classification Search
CPC .. A61B 5/055; G01R 33/4828; G01R 33/543; G01R 33/50; G01R 33/5608
USPC ....................................................... 324/318
See application file for complete search history.

(56) References Cited

U.S. PATENT DOCUMENTS

| 5,529,068 | A | 6/1996 | Hoenninger, III et al. |
| 6,469,509 | B2 | 10/2002 | Friedrich et al. |
| 7,294,010 | B1 | 11/2007 | Shaikh |
| 7,548,064 | B1 | 6/2009 | Wang et al. |
| 7,821,402 | B2 | 10/2010 | Yang et al. |
| 7,859,263 | B2 | 12/2010 | Matsuda et al. |
| 7,922,529 | B1 * | 4/2011 | Meurer .................. H01R 24/50 439/248 |
| 8,013,609 | B2 | 9/2011 | Vartiovaara |
| 8,515,696 | B2 | 8/2013 | Huff et al. |
| 9,000,766 | B2 | 4/2015 | Chu et al. |

(Continued)

FOREIGN PATENT DOCUMENTS

| CN | 101573630 A | 11/2009 |
| CN | 103376429 A | 10/2013 |

(Continued)

OTHER PUBLICATIONS

International Search Report and Written Opinion for International Application No. PCT/US2016/044432 dated Nov. 8, 2016. 13 pages.

*Primary Examiner* — Walter L Lindsay, Jr.
*Assistant Examiner* — Frederick Wenderoth
(74) *Attorney, Agent, or Firm* — McCoy Russell LLP (57) ABSTRACT

Various methods and systems are provided for detecting an unplugged radio frequency (RF) coil in a magnetic resonance imaging (MRI) system. In one embodiment, a device for an RF coil comprises an alert generator, a power source, and a field-sensitive switch including an open state and a closed state, wherein the field-sensitive switch switches from the open state to the closed state responsive to sensing a magnetic field with a strength above a threshold, and wherein the field-sensitive switch in the closed state electrically couples the alert generator and the power source. In this way, an alert may be generated to notify an operator of an MRI apparatus of an unplugged RF coil.

21 Claims, 6 Drawing Sheets

(56) References Cited

U.S. PATENT DOCUMENTS

| | | |
|---|---|---|
| 2002/0080911 A1 | 6/2002 | Friedrich et al. |
| 2007/0047184 A1* | 3/2007 | Tsao .................. G06F 3/0202 |
| | | 361/679.08 |
| 2007/0257800 A1 | 11/2007 | Yang et al. |
| 2009/0251316 A1* | 10/2009 | Mamourian ... G01B 31/318547 |
| | | 340/540 |
| 2010/0039113 A1 | 2/2010 | Vartiovaara et al. |
| 2012/0112747 A1 | 5/2012 | Alexiuk et al. |
| 2012/0191383 A1 | 7/2012 | Huff et al. |
| 2012/0306499 A1* | 12/2012 | Hamamura ........ G01R 33/3642 |
| | | 324/322 |
| 2013/0271129 A1 | 10/2013 | Kess |
| 2014/0002085 A1 | 1/2014 | Biber et al. |
| 2014/0307764 A1 | 10/2014 | Adolf et al. |
| 2015/0025358 A1 | 1/2015 | Emaci et al. |

FOREIGN PATENT DOCUMENTS

| | | |
|---|---|---|
| DE | 10051155 A1 | 5/2002 |
| DE | 10051155 C2 | 9/2002 |
| EP | 1852810 A1 | 11/2007 |
| EP | 1852810 B1 | 5/2011 |
| EP | 2827166 A1 | 1/2015 |
| KR | 20130116207 A | 10/2013 |
| WO | 2008078270 A1 | 7/2008 |

\* cited by examiner

METHODS AND DEVICES FOR RF COILS IN MRI SYSTEMS

FIELD

Embodiments of the subject matter disclosed herein relate to magnetic resonance imaging (MRI), and more particularly, to detecting disconnected radio-frequency (RF) coils in an MRI system.

BACKGROUND

Magnetic resonance imaging (MRI) is a medical imaging modality that can create pictures of the inside of a human body without using x-rays or other ionizing radiation. MRI uses a powerful magnet to create a strong, uniform, static magnetic field. When a human body, or part of a human body, is placed in the magnetic field, the nuclear spins associated with the hydrogen nuclei in tissue water become polarized, wherein the magnetic moments associated with these spins become preferentially aligned along the direction of the magnetic field, resulting in a small net tissue magnetization along that axis. MRI systems also include gradient coils that produce smaller amplitude, spatially-varying magnetic fields with orthogonal axes to spatially encode the MR signal by creating a signature resonance frequency at each location in the body. Radio frequency (RF) coils are then used to create pulses of RF energy at or near the resonance frequency of the hydrogen nuclei, which add energy to the nuclear spin system. As the nuclear spins relax back to their rest energy state, they release the absorbed energy in the form of an RF signal. This signal is detected by the MRI system and is transformed into an image using a computer and known reconstruction algorithms.

As mentioned, RF coils are used in MRI systems to transmit RF excitation signals and to receive MR signals, the RF signals emitted by an imaging subject. Various types of RF coils may be used in an MRI system such as a whole-body RF coil and RF surface (or local) coils. While whole-body RF coils are used in transmit and receive mode, RF surface (or local) coils can be designed either for use in transmit and receive mode or for receive mode only. An operator of the MRI system may select a particular RF coil for a given imaging objective, and so the RF coils are typically removable from the MRI system. It is possible that an RF coil may be unplugged from the MRI system but not removed from the imaging region where the magnetic fields are generated.

Unplugged RF coils in the magnet bore are currently not detected by the MRI system. Typically, RF coils are configured to passively and/or actively decouple the coil from the MRI system in order prevent or reduce absorption of RF energy by the coil when it is not in use. However, unplugged RF coils typically have limited passive decoupling and thus may absorb RF energy during imaging. As a result, unplugged RF coils are prone to producing excessive amounts of heat which can damage or destroy the coil and which poses a safety hazard to the patient who is in contact with the coil. Additionally, unplugged coils can cause image artifacts by distorting local transmit and receive sensitivities of other nearby RF coils used for imaging. In any case, the presence of unplugged RF coils in the MRI system during imaging is typically unintentional and should be avoided.

One approach to alerting an operator of the presence of RF coils is to attach RFID tags to RF coils. However, this approach detects an RF coil based on proximity only, and does not distinguish between RF coils inside or outside the magnet bore.

BRIEF DESCRIPTION

In one embodiment, a device for a radio frequency (RF) coil comprises an alert generator, a power source, and a field-sensitive switch including an open state and a closed state, wherein the field-sensitive switch switches from the open state to the closed state responsive to sensing a magnetic field with a strength above a threshold, and wherein the field-sensitive switch in the closed state electrically couples the alert generator and the power source. In this way, an alert may be generated to notify an operator of an MRI apparatus of an unplugged RF coil. The operator may then either remove the RF coil from the imaging space or connect the RF coil to the MRI apparatus. As a result, damage to the RF coil and injury to the patient can be avoided and the quality of images can be preserved.

It should be understood that the brief description above is provided to introduce in simplified form a selection of concepts that are further described in the detailed description. It is not meant to identify key or essential features of the claimed subject matter, the scope of which is defined uniquely by the claims that follow the detailed description. Furthermore, the claimed subject matter is not limited to implementations that solve any disadvantages noted above or in any part of this disclosure.

BRIEF DESCRIPTION OF THE DRAWINGS

The present invention will be better understood from reading the following description of non-limiting embodiments, with reference to the attached drawings, wherein below.

DETAILED DESCRIPTION

Figure 2:
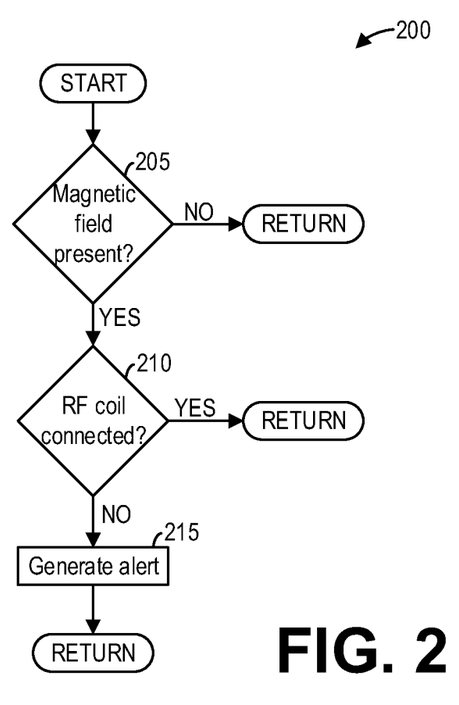
FIG. 2 is a high-level flow chart illustrating an example method for generating an alert.
Figure 3:
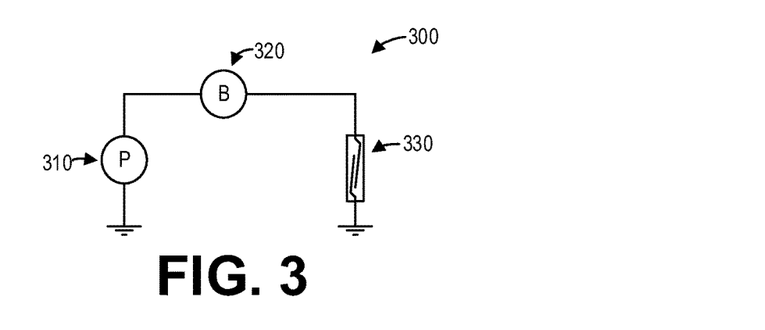
FIG. 3 is a schematic diagram illustrating an example disconnected coil alert system.
Figure 4:
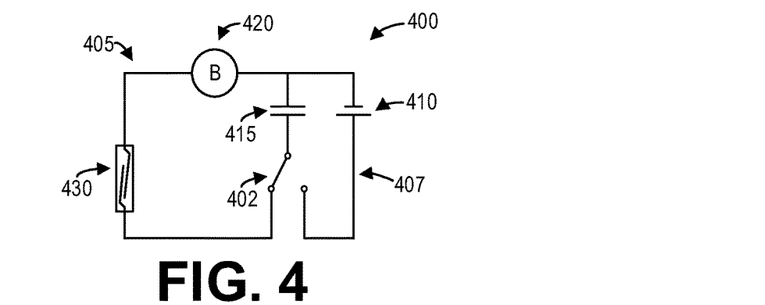
FIG. 4 is a schematic diagram illustrating an example disconnected coil alert system when a coil is disconnected.
Figure 5:
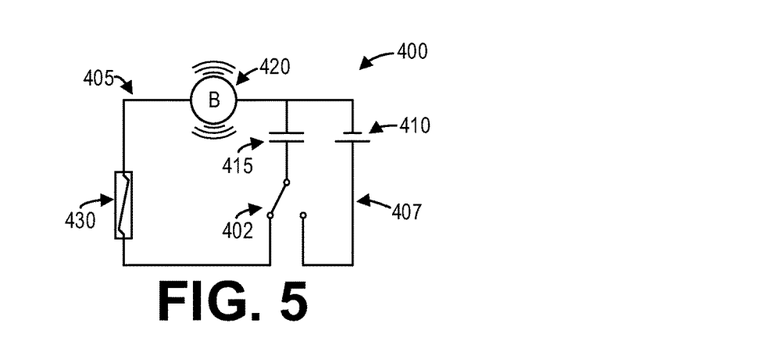
FIG. 5 is a schematic diagram illustrating an example disconnected coil alert system when a coil is disconnected and a magnetic field is present.
Figure 6:
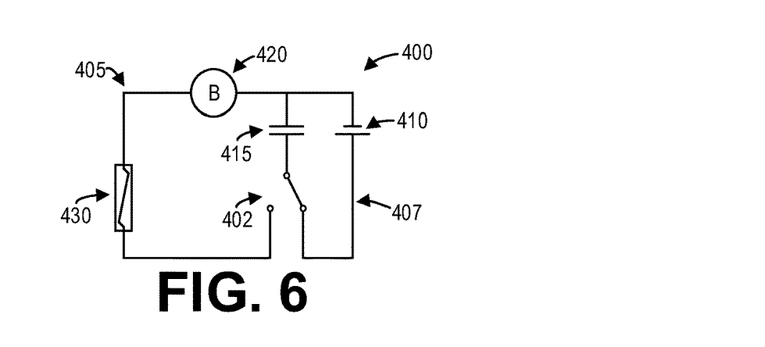
FIG. 6 is a schematic diagram illustrating an example disconnected coil alert system when a coil is connected and a magnetic field is present.
Figure 7:
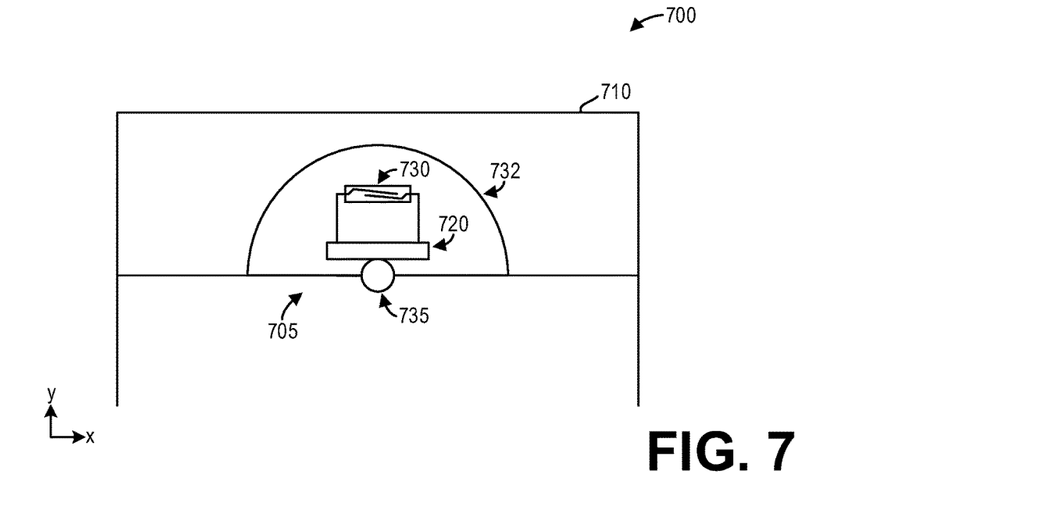
FIG. 7 is a pictorial diagram illustrating an example disconnected coil alert system with magnetic field shielding in a closed state.
Figure 8:
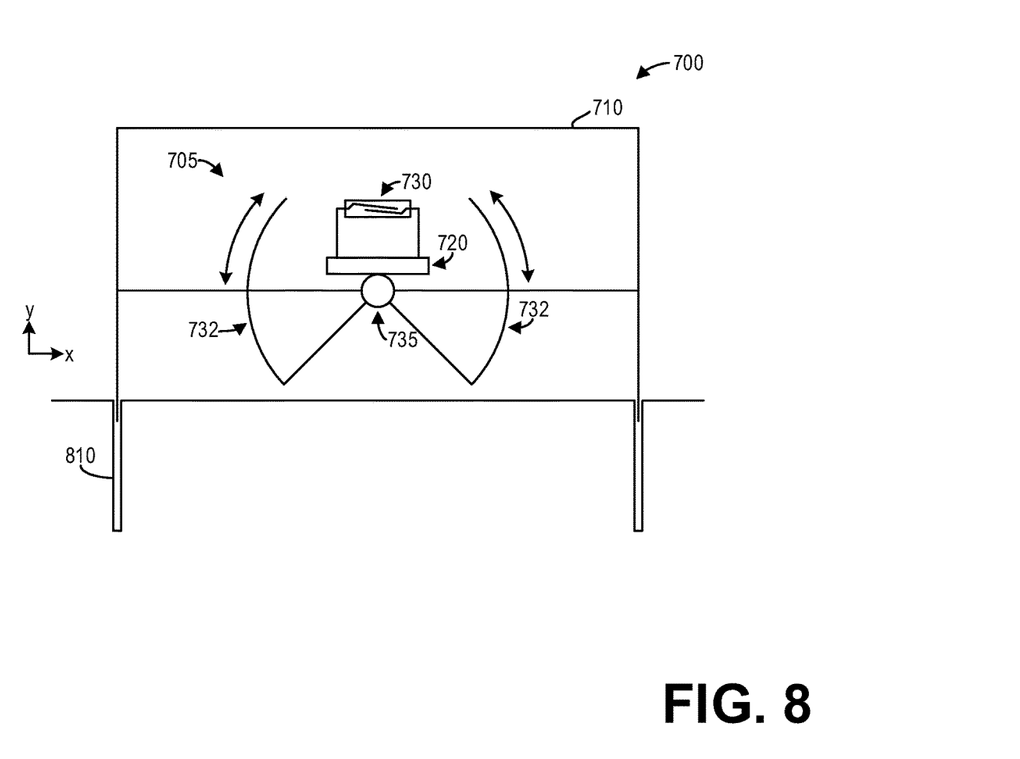
FIG. 8 is a pictorial diagram illustrating an example disconnected coil alert system with magnetic field shielding in an open state.

The following description relates to various embodiments of RF coils for MRI systems. In particular, methods and systems are provided for detecting an unplugged RF coil in an MRI system, such as the MRI system depicted in FIG. 1. As shown in FIG. 2, a method includes generating an alert responsive to determining that an RF coil is disconnected from the MRI system when a magnetic field is present. A circuit for generating an alert responsive to a magnetic field is shown in FIG. 3. FIGS. 4-6 show various states of an alert system which generates an alert responsive to a magnetic field, and uses a two-way switch to determine if the RF coil is connected. FIGS. 7-8 show various states of an alert system which generates an alert responsive to a magnetic field, and uses magnetic field shielding to determine if the RF coil is connected. An alert system such as those described herein may be implemented in an RF coil unit connector, such as the connector depicted in FIG. 9, and may specifically detect when the connector is coupled to a port, such as the port depicted in FIG. 10. FIG. 11 shows an alert system that does not include a local power source, but instead is driven by external magnetic fields such as those generated by gradient coils or RF transmit coils of the MRI system.

Figure 1:
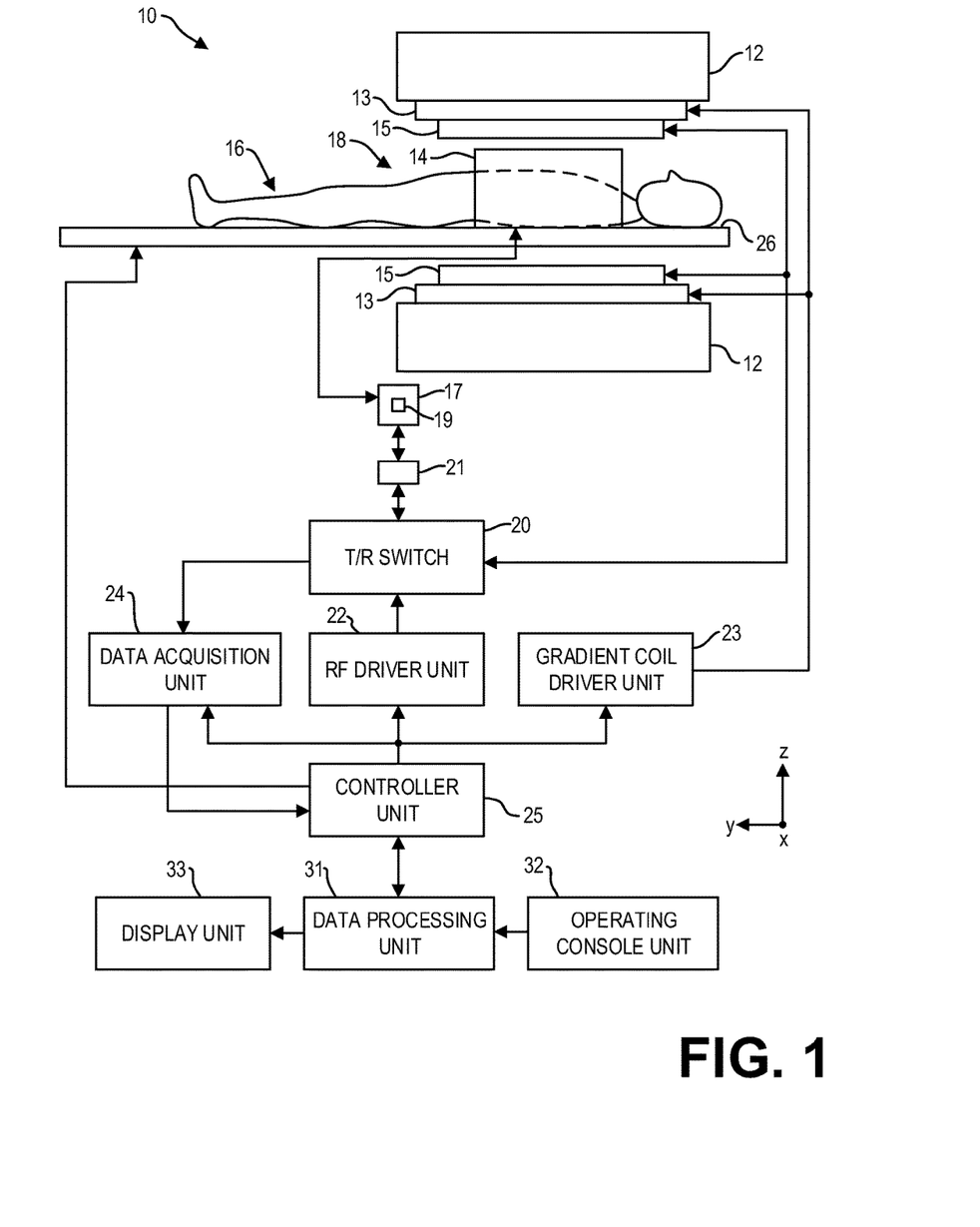
FIG. 1 is a block diagram of an MRI system according to an embodiment of the invention.

FIG. 1 illustrates a magnetic resonance imaging (MRI) apparatus 10 that includes a magnetostatic field magnet unit 12, a gradient coil unit 13, an RF coil unit 14, an RF body coil unit 15, a transmit/receive (T/R) switch 20, an RF port interface 21, an RF driver unit 22, a gradient coil driver unit 23, a data acquisition unit 24, a controller unit 25, a patient bed 26, a data processing unit 31, an operating console unit 32, and a display unit 33. The MRI apparatus 10 transmits electromagnetic pulse signals to a subject 16 placed in an imaging space 18 with a magnetostatic field formed to perform a scan for obtaining magnetic resonance signals from the subject 16 to reconstruct an image of the slice of the subject 16 based on the magnetic resonance signals thus obtained by the scan.

The magnetostatic field magnet unit 12 includes, for example, typically an annular superconducting magnet, which is mounted within a toroidal vacuum vessel. The magnet defines a cylindrical space surrounding the subject 16, and generates a constant primary magnetostatic field along the Z direction of the cylinder space.

The MRI apparatus 10 also includes a gradient coil unit 13 that forms a gradient magnetic field in the imaging space 18 so as to provide the magnetic resonance signals received by the RF coil unit 14 with three-dimensional positional information. The gradient coil unit 13 includes three gradient coil systems, each of which generates a gradient magnetic field which inclines into one of three spatial axes perpendicular to each other, and generates a gradient field in each of frequency encoding direction, phase encoding direction, and slice selection direction in accordance with the imaging condition. More specifically, the gradient coil unit 13 applies a gradient field in the slice selection direction of the subject 16, to select the slice; and the RF coil unit 14 transmits an RF pulse to a selected slice of the subject 16 and excites it. The gradient coil unit 13 also applies a gradient field in the phase encoding direction of the subject 16 to phase encode the magnetic resonance signals from the slice excited by the RF pulse. The gradient coil unit 13 then applies a gradient field in the frequency encoding direction of the subject 16 to frequency encode the magnetic resonance signals from the slice excited by the RF pulse.

The RF coil unit 14 is disposed, for example, to enclose the region to be imaged of the subject 16. In the static magnetic field space or imaging space 18 where a static magnetic field is formed by the magneto static field magnet unit 12, the RF coil unit 14 transmits, based on a control signal from the controller unit 25, an RF pulse that is an electromagnet wave to the subject 16 and thereby generates a high-frequency magnetic field. This excites a spin of protons in the slice to be imaged of the subject 16. The RF coil unit 14 receives, as a magnetic resonance signal, the electromagnetic wave generated when the proton spin thus excited in the slice to be imaged of the subject 16 returns into alignment with the initial magnetization vector. The RF coil unit 14 may transmit and receive an RF pulse using the same RF coil.

The RF body coil unit 15 is disposed, for example, to enclose the imaging space 18, and produces RF magnetic field pulses orthogonal to the main magnetic field produced by the magnetostatic field magnet unit 12 within the imaging space 18 to excite the nuclei. In contrast to the RF coil unit 14, which may be easily disconnected from the MR apparatus 10 and replaced with another RF coil unit, the RF body coil unit 15 is fixedly attached and connected to the MR apparatus 10. Furthermore, whereas local coils such as those comprising the RF coil unit 14 can transmit to or receive signals from only a localized region of the subject 16, the RF body coil unit 15 generally has a larger coverage area and can be used to transmit or receive signals to the whole body of the subject 16. Using receive-only local coils and transmit body coils provides a uniform RF excitation and good image uniformity at the expense of high RF power deposited in the subject. For a transmit-receive local coil, the local coil provides the RF excitation to the region of interest and receives the MR signal, thereby decreasing the RF power deposited in the subject. It should be appreciated that the particular use of the RF coil unit 14 and/or the RF body coil unit 15 depends on the imaging application.

The T/R switch 20 can selectively electrically connect the RF body coil unit 15 to the data acquisition unit 24 when operating in receive mode, and to the RF driver unit 22 when operating in transmit mode. Similarly, the T/R switch 20 can selectively electrically connect the RF coil unit 14 to the data acquisition unit 24 when the RF coil unit 14 operates in receive mode, and to the RF driver unit 22 when operating in transmit mode. When the RF coil unit 14 and the RF body coil unit 15 are both used in a single scan, for example if the RF coil unit 14 is configured to receive MR signals and the RF body coil unit 15 is configured to transmit RF signals, then the T/R switch 20 may direct control signals from the RF driver unit 22 to the RF body coil unit 15 while directing received MR signals from the RF coil unit 14 to the data acquisition unit 24. The coils of the RF body coil unit 15 may be configured to operate in a transmit-only mode, a receive-only mode, or a transmit-receive mode. The coils of the local RF coil unit 14 may be configured to operate in a transmit-receive mode or a receive-only mode.

The RF driver unit 22 includes a gate modulator (not shown), an RF power amplifier (not shown), and an RF oscillator (not shown) that are used to drive the RF coil unit 14 and form a high-frequency magnetic field in the imaging space 18. The RF driver unit 22 modulates, based on a control signal from the controller unit 25 and using the gate modulator, the RF signal received from the RF oscillator into a signal of predetermined timing having a predetermined envelope. The RF signal modulated by the gate modulator is amplified by the RF power amplifier and then output to the RF coil unit 14.

The gradient coil driver unit 23 drives the gradient coil unit 13 based on a control signal from the controller unit 25 and thereby generates a gradient magnetic field in the imaging space 18. The gradient coil driver unit 23 includes three systems of driver circuits (not shown) corresponding to the three gradient coil systems included in the gradient coil unit 13.

The data acquisition unit 24 includes a preamplifier (not shown), a phase detector (not shown), and an analog/digital converter (not shown) used to acquire the magnetic resonance signals received by the RF coil unit 14. In the data acquisition unit 24, the phase detector phase detects, using the output from the RF oscillator of the RF driver unit 22 as a reference signal, the magnetic resonance signals received from the RF coil unit 14 and amplified by the preamplifier, and outputs the phase-detected analog magnetic resonance signals to the analog/digital converter for conversion into digital signals. The digital signals thus obtained are output to the data processing unit 31.

The MRI apparatus 10 includes a table 26 for placing the subject 16 thereon. The subject 16 may be moved inside and outside the imaging space 18 by moving the table 26 based on control signals from the controller unit 25.

The controller unit 25 includes a computer and a recording medium on which a program to be executed by the computer is recorded. The program when executed by the computer causes various parts of the apparatus to carry out operations corresponding to pre-determined scanning. The recording medium may comprise, for example, a ROM, flexible disk, hard disk, optical disk, magneto-optical disk, CD-ROM, or non-volatile memory card. The controller unit 25 is connected to the operating console unit 32 and processes the operation signals input to the operating console unit 32 and furthermore controls the table 26, RF driver unit 22, gradient coil driver unit 23, and data acquisition unit 24 by outputting control signals to them. The controller unit 25 also controls, to obtain a desired image, the data processing unit 31 and the display unit 33 based on operation signals received from the operating console unit 32.

The operating console unit 32 includes user input devices such as a keyboard and a mouse. The operating console unit 32 is used by an operator, for example, to input such data as an imaging protocol and to set a region where an imaging sequence is to be executed. The data about the imaging protocol and the imaging sequence execution region are output to the controller unit 25.

The data processing unit 31 includes a computer and a recording medium on which a program to be executed by the computer to perform predetermined data processing is recorded. The data processing unit 31 is connected to the controller unit 25 and performs data processing based on control signals received from the controller unit 25. The data processing unit 31 is also connected to the data acquisition unit 24 and generates spectrum data by applying various image processing operations to the magnetic resonance signals output from the data acquisition unit 24.

The display unit 33 includes a display device and displays an image on the display screen of the display device based on control signals received from the controller unit 25. The display unit 33 displays, for example, an image regarding an input item about which the operator inputs operation data from the operating console unit 32. The display unit 33 also displays a slice image of the subject 16 generated by the data processing unit 31.

Different RF coil units may be utilized for different scanning objectives. To that end, the RF coil unit 14 may be disconnected from the MRI apparatus 10, so that a different RF coil unit may be connected to the MRI apparatus 10. The RF coil unit 14 may be coupled to the T/R switch 20, and thus to the RF driver unit 22 and the data acquisition unit 24, via a connector 17 and an RF port interface 21. Specifically, the connector 17 may be plugged into the RF port interface 21 to electronically couple the RF coil unit 14 to the T/R switch 20. Using a single connector 17, fixedly attached to the RF coil unit 14, enables easy interchangeability of RF coil units.

If the RF coil unit 14 is disconnected from the MRI apparatus 10 but is present within the imaging space 18 while the MRI apparatus 10 is operating, the RF coil unit 14 may generate excessive amounts of heat leading to potential injury to the subject 16 and damage to the RF coil unit 14. A method for alerting an operator that the RF coil unit 14 is disconnected is described further herein with regard to FIG. 2. As described further herein, the connector 17 may include an alert system 19 which alerts an operator of the MRI apparatus 10 that the RF coil unit 14 is not connected to the RF port interface 21. Several examples of an alert system 19 are described further herein with regard to FIGS. 3-8. One embodiment of a connector 17 and an RF port interface 21 is described further herein with regard to FIGS. 9 and 10.

FIG. 2 shows a high-level flow chart illustrating an example method 200 for generating an alert according to an embodiment. In particular, method 200 relates to generating an alert regarding an unplugged RF coil unit.

Method 200 begins at 205. At 205, method 200 includes determining if a magnetic field is present. Specifically, determining if a magnetic field is present comprises determining if the RF coil unit is immersed in a magnetic field.

In one example, determining if a magnetic field is present may comprise sensing a magnetic field using a magnetic field-sensitive switch, such as a reed switch or a Hall effect sensor. The field-sensitive switch may be configured to switch when exposed to a magnetic field whose strength is above a specified magnetic field threshold. The magnetic field threshold may be selected such that the field-sensitive switch does not switch in the mere presence of an ambient magnetic field, such as the magnetic field of the Earth, in addition to other sources of ambient magnetic fields. Thus, the magnetic field threshold should be at least above 1 Gauss or 100 microteslas.

If a magnetic field is not present ("NO"), method 200 returns. However, if a magnetic field is present ("YES"), method 200 continues to 210.

At 210, method 200 includes determining if the RF coil unit is connected to the MRI system. In one example, if the RF coil unit is connected to the MRI system ("YES"), then a two-way switch may be switched such that an alert device is disconnected from a power source (for example, a capacitor or a battery which may supply current to the alert device), thereby disabling the alert device. In some examples, the two-way switch may connect the power source to a charging power source (fixedly attached to the MRI system) which provides current to the power source, thereby charging the power source. No alert is generated, and method 200 returns.

Similarly, if the RF coil unit is disconnected from the MRI system ("NO"), then the two-way switch may be switched such that the alert device is connected to the power source, thereby enabling the alert device. In some examples, the two-way switch may also disconnect the power source from the charging power source. Such an example is described further herein and with regard to FIGS. 4-6.

In another example, if the RF coil unit is connected to the MRI system, then a magnetic field shielding is closed around the field-sensitive switch discussed above ("YES"). Similarly, if the RF coil unit is disconnected from the MRI system, then the magnetic field shielding is open and the field-sensitive switch is exposed to the magnetic field ("NO"). Such an example is described further herein and with regard to FIGS. 7-8.

In yet another example, the alert device may be driven by a dynamic magnetic field (e.g., a magnetic field generated by gradient coils or the RF transmit coil). In such an example, the alert device may not be selectively coupled to a local power source such as a capacitor or a battery. Instead, the act of sensing an external magnetic field may comprise a dynamic external magnetic field inducing current in the alert device and therefore powering the alert device. As discussed further herein, when the alert device is powered by the dynamic magnetic field, the alert device may, as non-limiting examples, generate an audible alert, wirelessly transmit a signal to the MRI system which upon receiving the signal may disable the magnetic field (e.g., by disabling the RF driver unit and/or the gradient coil driver unit), and so on. In such an example, a magnetic field shielding may enclose the alert device when the RF coil unit is coupled to the MRI apparatus ("YES") such that the external magnetic field does not drive the alert device. Similarly, the magnetic field shielding may not enclose the alert device when the RF coil unit is uncoupled from the MRI apparatus ("NO") such that the external magnetic field drives the alert device. Such an example is described further herein with regard to FIG. 11. Alternatively, DC bias provided by the MRI apparatus may disable the alert device when the RF coil unit is coupled to the MRI apparatus, similar to the method of passive detuning of RF coils.

If the RF coil is connected ("YES"), method 200 returns. However, if the RF coil is not connected ("NO"), method 200 continues to 215. At 215, method 200 includes generating an alert. In one example, generating an alert may comprise generating an audible signal. For example, a buzzer may generate an audible sound loud enough to alert an operator of the MRI apparatus of the disconnected coil. In one example, when the method returns, it does so without generating an alert, and/or deactivates any currently generated alerts.

Additionally or alternatively, generating an alert may comprise transmitting a signal to the controller unit to inhibit scanning and/or otherwise generate a visual and/or auditory alert to an operator of the MRI system. For example, an RF link may send a wireless signal which sets a "coil present" switch to false. As a result, the RF amplifier may be deactivated until the disconnected coil is either removed from the imaging space or connected to the RF port interface. In some examples, the operator may manually confirm, for example via the operating console unit 32, that the disconnected coil is either removed or connected so that the "coil present" switch is set to true and the scanning system may be reactivated. An alert regarding the disconnected RF coil unit may be additionally or alternatively displayed to the operator via the display unit 33.

After generating the alert, method 200 returns. It should be appreciated that each time method 200 returns, method 200 returns to the beginning of method 200. In this way, the method may continuously monitor for a disconnected coil.

The method 200 may be implemented in various alert systems with a combination of hardware and/or software. Examples of such alert systems are described further herein with regard to FIGS. 3-10.

FIG. 3 shows a schematic diagram of an RF coil alert system 300 according to an embodiment. RF coil alert system 300 includes a power source 310, an alert device 320, and a field-sensitive switch 330 electrically coupled in series to ground.

The alert device 320 may comprise, as a non-limiting example, a buzzer which generates an audible signal when powered by the power source 310. The alert device 320 may be mechanical, electromechanical, piezoelectric, or another type of alert device. As another example, the alert device 320 may comprise a wireless transmitter configured to transmit a signal to the MRI controller unit to inhibit scanning. Additionally or alternatively, responsive to receiving the signal transmitted by the alert device 320 to the MRI controller unit, the MRI controller unit may generate an alert via pre-existing user interfaces. For example, a display unit may display a visual alert to an operator of the MRI apparatus, or separate speakers (for example, optionally included in the operating console unit of FIG. 1) may be used to generate an audible signal.

In one non-limiting example, the field-sensitive switch 330 may comprise a reed switch. As another non-limiting example, the field-sensitive switch 330 may comprise a Hall effect sensor. The field-sensitive switch 330 may be configured to be normally open in the absence of a magnetic field, and normally closed in the presence of a magnetic field. When the power source 310, the alert device 320, and the field-sensitive 330 are coupled as depicted, current only flows from the power source 310 to the alert device 320 when the field-sensitive switch 330 is closed. In this way, the alert device 320 is activated in the presence of a magnetic field.

Thus, for the alert system 300, the power supply 310 supplies current to the alert device 320 when the field-sensitive switch 330 closes in the presence of a magnetic field above a threshold. In this way, when physically attached to an RF coil unit, the alert system 300 generates an alert whenever the RF coil unit is immersed in a magnetic field. Additional elements may be added to the alert system 300 in order to fully implement the method of FIG. 2. Specifically, additional elements which determine if the RF coil unit is connected to an MRI apparatus should be included in order to prevent the alert device 320 from generating an alert when the RF coil unit is connected to the MRI apparatus. Various embodiments for determining if the RF coil unit is connected to the MRI apparatus are described further herein with regard to FIGS. 4-10.

It should be appreciated that, although the alert system 300 described herein above is described with regard to an RF coil unit, the alert system 300 may be implemented in any apparatus or device to help prevent their unintended entry into a magnetic field.

FIGS. 4-6 show a schematic diagram of an RF coil alert system 400 in various states according to an embodiment. In particular, FIG. 4 shows the RF coil alert system 400 when the RF coil unit is disconnected in the absence of a magnetic field, FIG. 5 shows the RF coil alert system 400 when the RF coil unit is disconnected in the presence of a magnetic field, and FIG. 6 shows the RF coil alert system 400 when the RF coil unit is connected.

The RF coil alert system 400 includes a two-way switch 402 which divides the RF coil alert system 400 into an alert circuit 405 and a power circuit 407. The two-way switch 402 completes the alert circuit 405 when the RF coil unit is disconnected and completes the power circuit 407 when the RF coil unit is connected. The two-way switch may comprise, as a non-limiting example, a spring-loaded electromechanical switch that operates a shielding to prevent the magnetic field from closing the field-sensitive switch when the RF coil is connected.

The alert circuit 405 includes a capacitor 415, an alert device 420, and a field-sensitive switch 430. The capacitor 415 stores electrical charge which may supply current through the alert circuit 405 when the field-sensitive switch 430 is closed. The field-sensitive switch 430, which in some examples may comprise a reed switch or a Hall effect sensor, is normally open in the absence of a magnetic field and is normally closed in the presence of a magnetic field.

The power circuit 407 includes a voltage source 410 and the capacitor 415. When the power circuit 407 is completed via the two-way switch 402, the voltage source 410 is electrically coupled in series with the capacitor 415. The voltage source 410 provides current which flows to the capacitor 415, thereby charging the capacitor 415. When the capacitor is fully charged, current ceases to flow.

As shown in FIG. 4, the two-way switch 402 is switched to the alert circuit 405. No magnetic field is present, and so the field-sensitive switch 430 is open. Since the field-sensitive switch 430 is open, the capacitor 415 does not discharge and so current does not flow through the alert circuit 405. As a result, the alert device 420 is not activated and does not produce an alert signal.

In contrast, as shown in FIG. 5, a magnetic field is present which causes the field-sensitive switch 430 to close. Since the two-way switch 402 is switched to the alert circuit 405 and the field-sensitive switch 430 is closed, the alert circuit 405 is complete and the capacitor 415 discharges. Current flows to the alert device 420, thereby activating the alert device 420. Since the closure of the two-way switch 402 indicates that the RF coil unit is disconnected, the alert signal produced by the alert device 420 alerts an operator that the RF coil unit is disconnected.

Finally, as shown in FIG. 6, the RF coil unit is connected and so the two-way switch 402 is switched to the power circuit 407. In this way, the alert circuit 405 is disabled. Even if a magnetic field is present, thereby causing the field-sensitive switch 430 to close as depicted, current does not flow to the alert device 420 and so no alert is generated. Instead, the voltage source 410 charges the capacitor 415 if the capacitor is not fully charged. If the capacitor 415 is fully charged, then the power circuit 407 is inactive.

As described herein above, an alert system may include a two-way switch to disable the alert when the RF coil unit is connected such that an alert device does not generate an alert in the presence of a magnetic field. As described further herein with regard to FIGS. 7 and 8, in some examples shielding may be used instead of a two-way switch to prevent the alert device from generating an alert in the presence of a magnetic field.

FIGS. 7 and 8 show a cross-sectional pictorial diagram illustrating an RF coil unit connector 700 according to an embodiment. In particular, the RF coil unit connector 700 includes an alert system 705. As described further herein, the alert system 705 may include magnetic shielding 732 which shields a magnetic field-sensitive switch 730 when the RF coil unit connector 700 is connected to an MRI apparatus, such as the MRI apparatus 10 described herein above with regard to FIG. 1. RF coil unit connector 700 may comprise the connector 17 described herein above with regard to the system of FIG. 1, though it should be appreciated that the RF coil unit connector 700 may be implemented in other systems without departing from the scope of this disclosure.

The RF coil unit connector 700 includes a connector housing 710 which forms the structure of the RF coil unit connector 700. The RF coil unit connector 700 further includes an alert system 705 housed within the connector housing 710. The alert system 705 comprises an alert circuit 720, a field-sensitive switch 730, a shielding 732, and a spring 735.

The alert circuit 720 may include an alert device, a power source, and additional electrical circuit elements. The power source may, as non-limiting examples, comprise a battery or a capacitor. The alert device may comprise, in one example, a buzzer which generates an audible sound when powered. Additionally or alternatively, the alert device may comprise a transmitter which wirelessly transmits information to a controller, for example to inhibit scanning or otherwise alert an operator of the MRI system to the presence of an unplugged RF coil as described herein above with regard to FIG. 2. The additional electrical circuit elements may comprise any circuit elements which appropriately complete the circuit, including but not limited to resistors, capacitors, diodes, inductors, and so on.

As depicted, shielding 732 may comprise a hemispherical shielding which encloses the circuit 720 and the field-sensitive switch 730. The shielding 732 may comprise a high-permeability material such as an alloy which attenuates an external static magnetic field, such that the shielding 732 effectively reduces the strength of an external magnetic field within the shielding below a magnetic field threshold. The magnetic field threshold may be selected based on the field-sensitive switch 730; specifically, the magnetic field threshold may comprise a particular magnetic field strength above which the field-sensitive switch 730 reacts to the magnetic field. In some examples, the shielding 732 may comprise a shape other than hemispherical, for example cuboidal or pyramidal, in order to fit within the connector 700 and accommodate other components of the connector 700, as long as the shape of the shielding effectively attenuates external magnetic fields. It should be appreciated that a choice of shielding material(s) and construction of the shielding may depend on the type of magnetic field to be shielded (e.g., static, gradient, RF, and so on). The non-limiting example described above may be suitable for a static magnetic field.

As shown in FIG. 8, the hemispherical shielding 732 may be spring-loaded via spring 735. The hemispherical shielding closes when force is applied to the shielding. Force may be applied to the shielding 732 when, for example, the connector 700 is plugged into a port 810. As depicted, as the connector 700 is plugged into the port 810 (such that the connector 700 moves in the negative y direction as indicated in the figure), the surface of the port 810 exerts a force upon the shielding 732, closing the shielding 732 (i.e., the shielding 732 rotates about the spring 735 in the positive y direction). Once the connector 700 is fully inserted into the port 810, the shielding 732 is closed (for example, as depicted in FIG. 7). In this way, the shielding 732 closes when the connector 700 is connected such that the shielding 732 shields the field-sensitive switch 730 from an external magnetic field. As a result, the field-sensitive switch 730 remains open and no current is supplied to the alert device of the alert circuit 720.

When the RF coil unit connector 700 is disconnected from the port 810, the spring 735 pushes the shielding 732 outwards from the connector 700 (i.e., in the negative y direction), thereby exposing the field-sensitive switch 730 to an external magnetic field. In this way, when the connector 700 is disconnected from the MRI system, the shielding 732 is open and the field-sensitive switch 730 is not shielded from any external magnetic field. As a result, the field-sensitive switch 730 may close responsive to an external magnetic field, and in turn supply current to the alert device of the alert circuit 720.

Figure 9:
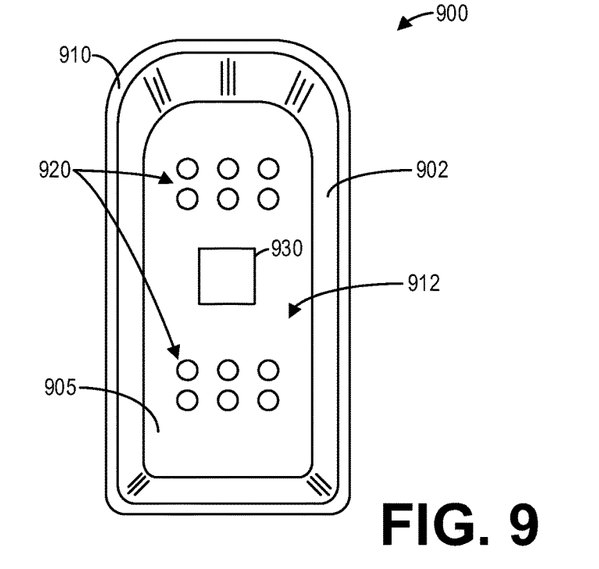
FIG. 9 is a pictorial diagram illustrating a connector interface including an alert system.
Figure 10:
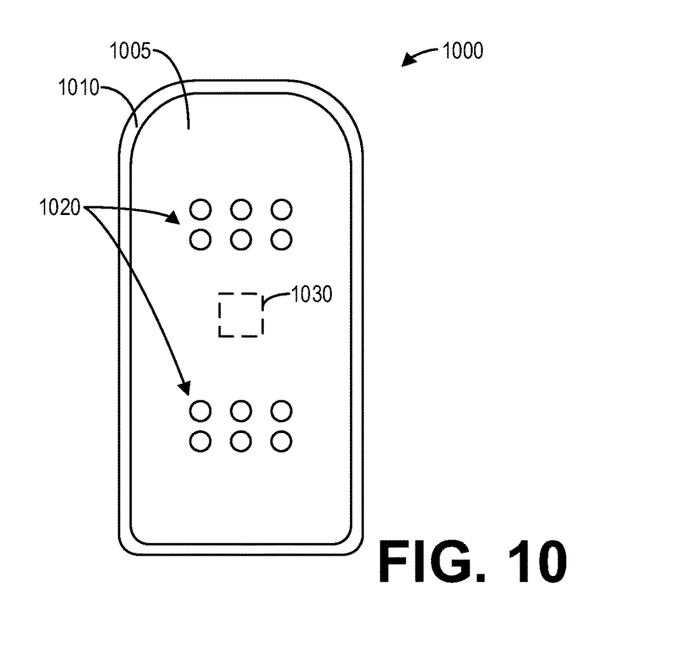
FIG. 10 is a pictorial diagram illustrating a port interface.
Figure 11:
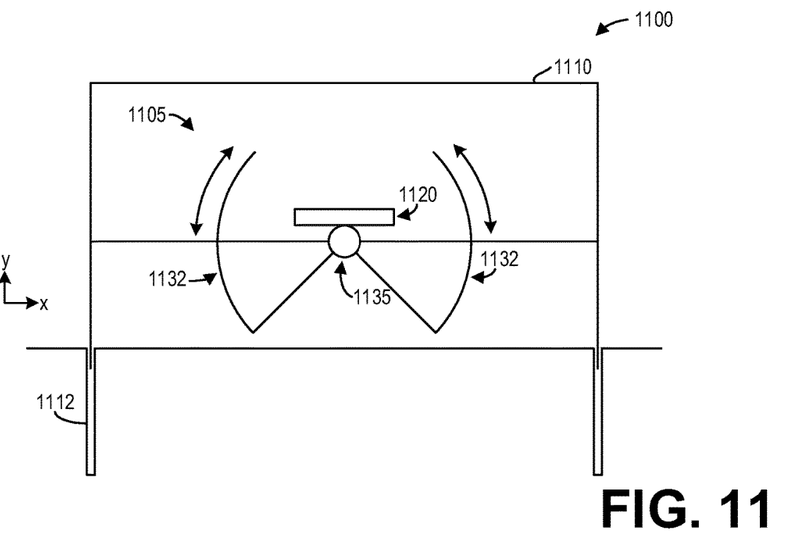
FIG. 11 is a pictorial diagram illustrating an example coil alert system with an alert device powered by external magnetic fields.

FIGS. 9 and 10 show perspective diagrams illustrating an RF coil unit connector 900 and an RF coil unit port 1000, respectively, according to an embodiment. The connector 900 may be fixedly coupled to an RF coil unit while the port 1000 may be fixedly coupled to an MRI apparatus, such as the RF coil unit 14 and the MRI apparatus 10 described herein above with regard to FIG. 1. The RF coil unit may thus be coupled to the MRI apparatus by connecting the connector 900 to the port 1000.

Referring specifically to FIG. 9, the connector 900 comprises a connector housing 902 which defines the structure of the connector, including a connector interface 905. The housing 902 further includes a protrusion 910 which extends outwards from the connector interface 905, thereby defining a cavity 912.

Referring specifically to FIG. 10, the port 1000 includes a cavity 1010 corresponding to the shape and size of the protrusion 910 of the connector 900. To connect the connector 900 to the port 1000, the protrusion 910 of the connector is inserted into the cavity 1010 such that the connector interface 905 physically contacts a port interface 1005.

Referring now to both FIGS. 9 and 10, the connector 900 includes a plurality of driver and acquisition interfaces 920, and the port 1000 similarly includes a corresponding plurality of driver and acquisition interfaces 1020. When the connector 900 is connected or plugged in to the port 1000, the interfaces 920 directly contact the interfaces 1020. In this way, RF signals may be transmitted from an RF driver unit, such as RF driver unit 22, to the RF coil unit, while MR signals may be transmitted from the RF coil unit to a data acquisition unit, such as data acquisition unit 24.

Note that in examples wherein connector 900 is coupled to a receive-only RF coil unit, then the connector 900 may only include acquisition interfaces of the driver and acquisition interfaces 920, while the driver interfaces of the driver and acquisition interfaces 920 may be included in a connector 900 coupled to a transmit-receive RF coil unit.

The connector 900 includes an alert system 930 which detects whether the connector 900 is connected to the port 1000, detects the presence of an external magnetic field, and generates an alert if a magnetic field is present and the connector 900 is not connected to the port 1000. In other words, the alert system 930 implements the method 200 described herein above with regard to FIG. 2. The alert system 930 detects the presence of an external magnetic field by way of a magnetic field-sensitive switch, such as a reed switch or a Hall effect sensor, as described herein above.

In one example, the mechanism for detecting whether the connector 900 is connected to the port 1000 may comprise a two-way switch, such as the two-way switch 402 described herein above with regard to FIGS. 4-6. When the connector 900 is connected to the port 1000, the two-way switch may be, as a non-limiting example, mechanically switched to disable the alert system 930.

In another example, the mechanism for detecting whether the connector 900 is connected may comprise a spring-loaded shielding, such as the shielding 732 described herein above with regard to FIGS. 7-8. When the connector 900 is connected to the port 1000, the port interface 1005 pushes on the spring-loaded shielding which thus encloses the field-sensitive switch of the alert system 930.

In some examples, port 1000 optionally includes a power source 1030 which charges a battery or capacitor of the alert system 930 when the connector 900 and the port 1000 are connected. As an example, the power source 1030 may comprise the voltage source 410 described herein above with regard to FIGS. 4-6, or the voltage source 310 described herein above with regard to FIG. 3.

In other examples, a battery or capacitor of the alert system 930 may be charged when the connector 900 is stored separately away from the MRI system, for example in a storage cabinet. In such examples, a voltage source may be applied to the alert system 930 to charge the battery or capacitor of the alert system 930. As one non-limiting example, inductive charging may be implemented so that the battery or capacitor may be wirelessly charged when stored separately away from the MRI system.

FIG. 11 shows a cross-sectional pictorial diagram illustrating an RF coil unit connector 1100 according to an embodiment. In particular, the RF coil unit connector 1100 includes an alert system 1105. As described further herein, the alert system 1105 may include magnetic shielding 1132 which shields an alert device 1120 when the RF coil unit connector 1100 is connected to an MRI apparatus, such as the MRI apparatus 10 described herein above with regard to FIG. 1. The RF coil unit connector 1100 may comprise the connector 17 described herein above with regard to the system of FIG. 1, though it should be appreciated that the RF coil unit connector 1100 may be implemented in other systems without departing from the scope of this disclosure.

The RF coil unit connector 1100 includes a connector housing 1110 which forms the structure of the RF coil unit connector 1100. The RF coil unit connector 1100 further includes an alert system 1105 housed within the connector housing 1110. The alert system 1105 comprises an alert device 1120, a shielding 1132, and a spring 1135.

The alert device 1120 may comprise a transmitter configured to transmit an alert signal to an MRI controller responsive to a magnetic field, for example to inhibit scanning or otherwise alert an operator of the MRI system to the presence of an unplugged RF coil as described herein above with regard to FIG. 2. Specifically, an external dynamic magnetic field may induce current in the alert device and thus power the alert device 1120. To that end, the alert device 1120 may include additional electrical circuit elements, which may comprise any circuit elements which appropriately complete the circuit, including but not limited to resistors, capacitors, diodes, inductors, and so on.

In contrast to the embodiment described herein above with regard to FIGS. 7 and 8, the alert system 1105 does not necessarily include a local power source or a field-sensitive switch because an external dynamic magnetic field functions as a power source and eliminates the need to explicitly sense the magnetic field. It should be appreciated that the alert device 1120 may, instead of a transmitter, comprise a buzzer as described herein above.

As depicted, shielding 1132 may comprise a hemispherical shielding which encloses the alert device 1120. The shielding 1132 may comprise a high-permeability material such as an alloy which attenuates an external magnetic field, such that the shielding 1132 effectively reduces the strength of an external magnetic field within the shielding below a magnetic field threshold. The hemispherical shielding 1132 may be spring-loaded via spring 1135. The hemispherical shielding closes when force is applied to the shielding. Force may be applied to the shielding 1132 when, for example, the connector 1100 is plugged into a port 1112. As depicted, as the connector 1100 is plugged into the port 1112 (such that the connector 1100 moves in the negative y direction as indicated in the figure), the surface of the port 1112 exerts a force upon the shielding 1132, closing the shielding 1132 (i.e., the shielding 1132 rotates about the spring 1135 in the positive y direction). Once the connector 1100 is fully inserted into the port 1112, the shielding 1132 is closed. In this way, the shielding 1132 closes when the connector 1100 is connected such that the shielding 1132 shields the alert device 1120 from an external magnetic field. As a result, the external magnetic field may not power the alert device 1120.

When the RF coil unit connector 1100 is disconnected from the port 1112, the spring 1135 pushes the shielding 1132 outwards from the connector 1100 (i.e., in the negative y direction), thereby exposing the alert device 1120 to an external magnetic field. In this way, when the connector 1100 is disconnected from the MRI system, the shielding 1132 is open and the alert device 1120 is not shielded from any external magnetic field. As a result, the external magnetic field may induce current in the alert device 1120 and thus power the alert device 1120.

Thus, in another embodiment, the high-frequency magnetic field generated by the RF transmit coil of the MRI system is used to activate and provide the power supply for the alert device. Furthermore, as one skilled in the art will readily appreciate, the same methods commonly used for passive decoupling of RF coils, where, for example, diodes are switched to detune the appropriate coil using RF energy from a transmitted pulse, can be utilized to detect the presence of the RF coil inside the bore of the MRI system. In this embodiment, the RF energy is used to power a transmitter which wirelessly transmits information to a controller, for example to inhibit scanning or otherwise alert an operator of the MRI system to the presence of an unplugged RF coil. Upon connecting the RF coil to the MRI system, the alert is disabled in the same way passive decoupling is commonly overridden, for example using DC bias from the MRI system.

In yet another embodiment, the time-varying magnetic field generated by the gradient coils of the MRI system is used to activate and provide the power supply for the alert. As one skilled in the art will readily appreciate, time-varying magnetic fields induce electric fields that can drive currents through appropriately configured conductors. Such currents can be utilized to detect the presence of the RF coil inside the bore of the MRI system. In this embodiment, the induced currents can be used to power a transmitter which wirelessly transmits information to a controller, for example to inhibit scanning or otherwise alert an operator of the MRI system to the presence of an unplugged RF coil. Upon connecting the RF coil to the MRI system, the alert is disabled, for example using DC bias from the MRI system.

It should be noted that the various embodiments may be implemented in hardware, software, or a combination thereof. The various embodiments and/or components, for example, the modules, or components and controllers therein, also may be implemented as part of one or more computers or processors. The computer or processor may include a computing device, an input device, a display unit, and an interface, for example, for accessing the Internet. The computer or processor may include a microprocessor. The microprocessor may be connected to a communication bus. The computer or processor may also include a memory. The memory may include Random Access Memory (RAM) and Read Only Memory (ROM). The computer or processor further may include a storage device, which may be a hard drive disk or a removable storage drive such as a floppy disk drive, optical disk drive, and the like. The storage device may also be other similar means for loading computer programs or other instructions into the computer or processor.

As used herein, the term "computer" or "module" may include any processor-based or microprocessor-based system including systems using microcontrollers, reduced instruction set computers (RISC), application-specific integrated circuits (ASIC), logic circuits, and any other circuit or processor capable of executing the functions described herein. The above examples are exemplary only, and are thus not intended to limit in any way the definition and/or meaning of the term computer.

The computer or processor executes a set of instructions that are stored in one or more storage elements, in order to process input data. The storage elements may also store data or other information as desired or needed. The storage element may be in the form of an information source or a physical memory element within a processing machine.

The set of instructions may include various commands that instruct the computer or processor as a processing machine to perform specific operations such as the methods and processes of the various embodiments of the invention. The set of instructions may be in the form of a software program. The software may be in various forms such as system software or application software and which may be embodied as a tangible and non-transitory computer readable medium. Further, the software may be in the form of a collection of separate programs or modules, a program module within a larger program or a portion of a program module. The software also may include modular programming in the form of object-oriented programming. The processing of input data by the processing machine may be in response to operator commands, or in response to results of previous processing, or in response to a request made by another processing machine.

As used herein, the terms "software" and "firmware" are interchangeable, and include any computer program stored in memory for execution by a computer, including RAM, ROM, EPROM, EEPROM, and non-volatile RAM (NVRAM). The above memory types are exemplary only, and are thus not limiting as to the types of memory usable for storage of a computer program.

The technical effect of the disclosure may include the generation of an audible alert responsive to an RF coil immersed in a magnetic field while disconnected from an MRI apparatus. Another technical effect of the disclosure may include the disabling of an MRI scan responsive to an RF coil disconnected from an MRI apparatus. Yet another technical effect includes the reduction of image artifacts caused by a disconnected RF coil.

In one embodiment, a device for a radio frequency (RF) coil comprises an alert generator, a power source, and a field-sensitive switch including an open state and a closed state, wherein the field-sensitive switch switches from the open state to the closed state responsive to sensing a magnetic field with a strength above a threshold, and wherein the field-sensitive switch in the closed state electrically couples the alert generator and the power source.

In one example, the device further comprises a magnetic field shielding that envelopes the field-sensitive switch in a first state and exposes the field-sensitive switch in a second state, wherein the magnetic field shielding is in the first state when the RF coil is coupled to a magnetic resonance imaging (MRI) apparatus and in the second state when the RF coil is not coupled to the MRI apparatus. As an example, the device further comprises a spring mechanically coupled to the magnetic field shielding and configured to adjust the shielding from the first state to the second state upon the RF coil disconnecting from the MRI apparatus and from the second state to the first state upon the RF coil connecting to the MRI apparatus.

In one example, the alert generator comprises a buzzer. The buzzer generates an audible signal when the field-sensitive switch couples the alert generator and the power source.

In one example, the power source comprises a capacitor. In another example, the power source comprises a battery.

In one example, the field-sensitive switch comprises a reed switch. In another example, the field-sensitive switch comprises a Hall effect sensor.

In one example, the device further comprises a two-way switch, wherein the two-way switch disconnects the alert generator from the power source when the RF coil is coupled to an MRI apparatus. In a related example, the two-way switch connects the power source to a second power source configured to charge the power source when the RF coil is coupled to the MRI apparatus. In some examples, the second power source is configured to wirelessly charge the power source when the RF coil is coupled to the MRI apparatus.

In another example, the field-sensitive switch senses the presence of one or more of a static magnetic field generated by a magnet of the MRI apparatus, a time-varying magnetic field generated by gradient coils of the MRI apparatus, and a high-frequency magnetic field generated by an RF transmit coil of the MRI apparatus.

In another embodiment, a system comprises an RF coil unit configured to receive MR signals, a data acquisition unit configured to receive the MR signals from the RF coil unit; a T/R switch coupled to the data acquisition unit and configured to direct the MR signals from the RF coil unit to the data acquisition unit, an RF port coupled to the T/R switch, and a connector fixedly attached to the RF coil unit and matable with the RF port, the connector configured to electronically couple the RF coil unit to the T/R switch when mated with the RF port, wherein the connector includes an alert device that generates an alert responsive to the RF coil unit in a magnetic field.

In one example, the system further comprises a switch that disables the alert device when the connector couples the RF coil unit to the RF port.

In another example, the system further comprises a magnetic field shielding that selectively encloses at least a field-sensitive switch when the connector couples the RF coil unit to the RF port, wherein the field-sensitive switch is electrically coupled to the alert device and supplies current to the alert device responsive to the magnetic field.

In another example, the system further comprises a controller coupled to an RF driver unit and communicatively coupled to the alert device, wherein activating the alert device comprises transmitting a signal to the controller whereupon the controller disables an RF amplifier of the RF driver unit.

In another example, the system further comprises an RF driver unit configured to drive the RF coil unit, wherein the RF coil unit is additionally configured to transmit RF pulses and wherein the connector attached to the RF coil unit is additionally configured to couple the RF coil unit and the RF driver unit via the RF port interface and T/R switch.

In yet another embodiment, a method for an RF coil comprises generating an alert responsive to a magnetic field when the RF coil is disconnected from a magnetic resonance imaging (MRI) apparatus.

In one example, generating the alert comprises activating a buzzer.

In another example, generating the alert comprises transmitting a signal to an MRI controller indicating that the RF coil is disconnected from the MRI apparatus. In a related example, the MRI controller disables an RF amplifier of the MRI apparatus responsive to receiving the signal. Additionally or alternatively, the MRI controller generates a visual alert and displays the visual alert on a display device responsive to receiving the signal.

In another example, the alert is generated responsive to the magnetic field when a field-sensitive switch senses a strength of the magnetic field above a threshold.

In yet another example, the alert is generated by an alert device powered by an external magnetic field.

In another embodiment, a system comprises: a radio frequency (RF) coil unit configured to receive and transmit RF pulses; an RF driver unit configured to power the RF coil unit; and a connector attached to the RF coil unit and configured to couple the RF coil unit and the RF driver unit via an RF port interface, the connector including an alert device and a switch that activates the alert device responsive to the RF coil unit in a magnetic field. In some examples, the system further comprises a data acquisition unit and a transmit/receive switch, wherein the transmit/receive switch is coupled to the data acquisition unit and the RF driver unit. The connector may be configured to couple the RF coil unit via the RF port interface to the transmit/receive switch, and thus to the RF driver unit and the data acquisition unit.

In one example, the system further comprises a second switch that disables the alert device when the connector couples the RF coil unit to the RF port interface.

In another example, the system further comprises a magnetic field shielding that selectively encloses at least the switch when the connector couples the RF coil unit to the RF port interface.

In yet another example, the system further comprises a controller coupled to the RF driver unit and communicatively coupled to the alert device, wherein activating the alert device comprises transmitting a signal to the controller whereupon the controller inhibits scanning.

In another example, the system further comprises a data acquisition unit, wherein the connector is further configured to couple the RF coil unit to the data acquisition unit.

In another example, generating the alert comprises transmitting a signal to an MRI system controller indicating that the RF coil is disconnected from the MRI apparatus. For example, the MRI system controller disables the RF amplifier responsive to receiving the signal.

In another example, the alert is generated responsive to the magnetic field when a field-sensitive switch senses a strength of the magnetic field above a threshold.

As used herein, an element or step recited in the singular and proceeded with the word "a" or "an" should be understood as not excluding plural of said elements or steps, unless such exclusion is explicitly stated. Furthermore, references to "one embodiment" of the present invention are not intended to be interpreted as excluding the existence of additional embodiments that also incorporate the recited features. Moreover, unless explicitly stated to the contrary, embodiments "comprising," "including," or "having" an element or a plurality of elements having a particular property may include additional such elements not having that property. The terms "including" and "in which" are used as the plain-language equivalents of the respective terms "comprising" and "wherein." Moreover, the terms "first," "second," and "third," etc. are used merely as labels, and are not intended to impose numerical requirements or a particular positional order on their objects.

This written description uses examples to disclose the invention, including the best mode, and also to enable a person of ordinary skill in the relevant art to practice the invention, including making and using any devices or systems and performing any incorporated methods. The patentable scope of the invention is defined by the claims, and may include other examples that occur to those of ordinary skill in the art. Such other examples are intended to be within the scope of the claims if they have structural elements that do not differ from the literal language of the claims, or if they include equivalent structural elements with insubstantial differences from the literal languages of the claims.

The invention claimed is:

1. A device for a magnetic resonance imaging (MRI) apparatus, comprising:
   an alert generator;
   a power source; and
   a field-sensitive switch including an open state and a closed state, wherein the field-sensitive switch switches from the open state to the closed state responsive to sensing a magnetic field with a strength above a threshold, and wherein the field-sensitive switch in the closed state electrically couples the alert generator and the power source, wherein the device is fixedly attached to a radio frequency (RF) coil unit of the MRI apparatus, the RF coil unit removable from the MRI apparatus; and
   a magnetic field shielding that envelopes the field-sensitive switch in a first state and exposes the field-sensitive switch in a second state, wherein the magnetic field shielding is in the first state when the RF coil unit is coupled to the MRI apparatus and in the second state when the RF coil unit is not coupled to the MRI apparatus.

2. The device of claim 1, wherein the magnetic field shielding comprises a hemispherical shielding.

3. The device of claim 1, wherein the magnetic field shielding reduces the magnetic field sensed by the field-sensitive switch below the threshold.

4. The device of claim 1, further comprising a spring mechanically coupled to the magnetic field shielding and configured to adjust the magnetic field shielding from the first state to the second state upon the RF coil unit disconnecting from the MRI apparatus and from the second state to the first state upon the RF coil unit connecting to the MRI apparatus.

5. The device of claim 1, wherein the alert generator comprises a buzzer.

6. The device of claim 1, wherein the field-sensitive switch comprises one of a reed switch or a Hall effect sensor.

7. The device of claim 1, further comprising a two-way switch, wherein the two-way switch disconnects the alert generator from the power source when the RF coil unit is electrically coupled to the MRI apparatus.

8. The device of claim 7, wherein the two-way switch connects the power source to a second power source configured to charge the power source when the RF coil unit is electrically coupled to the MRI apparatus.

9. The device of claim 8, wherein the two-way switch further disconnects the alert generator from the power source when the RF coil unit is stored away from the MRI apparatus, whereupon the second power source wirelessly charges the power source.

10. The device of claim 1, wherein the field-sensitive switch senses the presence of one or more of a static magnetic field generated by a magnet of the MRI apparatus, a time-varying magnetic field generated by gradient coils of the MRI apparatus, and a high-frequency magnetic field generated by an RF transmit coil of the MRI apparatus.

11. A system, comprising:
   a radio frequency (RF) coil unit configured to receive magnetic resonance (MR) signals;
   a data acquisition unit configured to receive the MR signals from the RF coil unit;
   a transmit/receive (T/R) switch coupled to the data acquisition unit and configured to direct the MR signals from the RF coil unit to the data acquisition unit;
   an RF port coupled to the T/R switch; and
   a connector fixedly attached to the RF coil unit and matable with the RF port, the connector configured to electronically couple the RF coil unit to the T/R switch when mated with the RF port, wherein the connector includes an alert device that generates an alert responsive to the RF coil unit in a magnetic field.

12. The system of claim 11, further comprising a switch that disables the alert device when the connector couples the RF coil unit to the RF port.

13. The system of claim 11, further comprising a magnetic field shielding that selectively encloses at least a field-sensitive switch when the connector couples the RF coil unit to the RF port, wherein the field-sensitive switch is electrically coupled to the alert device and supplies current to the alert device responsive to the magnetic field.

14. The system of claim 11, further comprising a controller coupled to an RF driver unit and communicatively coupled to the alert device, wherein generating the alert comprises transmitting a signal to the controller whereupon the controller disables an RF amplifier of the RF driver unit.

15. The system of claim 14, further comprising an RF driver unit configured to drive the RF coil unit, wherein the RF coil unit is additionally configured to transmit RF pulses and wherein the connector attached to the RF coil unit is additionally configured to couple the RF coil unit and the RF driver unit via the RF port interface and the T/R switch.

16. A method for an alert device coupled to a radio frequency (RF) coil, comprising:
   automatically generating, with the alert device, an alert responsive to a magnetic field when the RF coil is disconnected from a magnetic resonance imaging (MRI) apparatus.

17. The method of claim 16, wherein automatically generating the alert comprises sensing, with a field-sensitive switch of the alert device, the magnetic field, and automatically activating a buzzer of the alert device, the buzzer electrically coupled to the field-sensitive switch.

18. The method of claim 16, wherein automatically generating the alert responsive to the magnetic field comprises sensing, with the alert device, a strength of the magnetic field above a threshold, and automatically transmitting a signal from the alert device to an MRI controller indicating that the RF coil is disconnected from the MRI apparatus.

19. The method of claim 18, wherein the MRI controller disables an RF amplifier of the MRI apparatus responsive to receiving the signal from the alert device.

20. The method of claim 16, wherein the alert is automatically generated responsive to the magnetic field when a field-sensitive switch of the alert device senses a strength of the magnetic field above a threshold.

21. The method of claim 16, wherein the alert device is powered by the magnetic field.

* * * * *